US011594539B2

(12) United States Patent
Huang

(10) Patent No.: US 11,594,539 B2
(45) Date of Patent: Feb. 28, 2023

(54) SEMICONDUCTOR DEVICE WITH COMPOSITE DIELECTRIC STRUCTURE AND METHOD FOR FORMING THE SAME

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 58 days.

(21) Appl. No.: 17/319,363

(22) Filed: May 13, 2021

(65) Prior Publication Data
US 2022/0367476 A1    Nov. 17, 2022

(51) Int. Cl.
*H01L 27/108* (2006.01)
*H01L 49/02* (2006.01)

(52) U.S. Cl.
CPC .. *H01L 27/10855* (2013.01); *H01L 27/10808* (2013.01); *H01L 28/40* (2013.01); *H01L 27/10823* (2013.01)

(58) Field of Classification Search
None
See application file for complete search history.

(56) References Cited

U.S. PATENT DOCUMENTS

| 5,414,289 | A | * | 5/1995 | Fitch | ............... H01L 29/7827 257/E29.267 |
| 5,960,282 | A | * | 9/1999 | Chuang | ............. H01L 27/10823 438/242 |
| 2007/0069271 | A1 | * | 3/2007 | Kim | ................. H01L 28/91 257/E21.019 |
| 2020/0185387 | A1 | * | 6/2020 | Lim | .................. H01L 27/10882 |

FOREIGN PATENT DOCUMENTS

| TW | 201445701 A | 12/2014 |
| TW | 201735376 A | 10/2017 |
| TW | 201944547 A | 11/2019 |

* cited by examiner

*Primary Examiner* — Steven M Christopher
(74) *Attorney, Agent, or Firm* — Muncy, Geissler, Olds & Lowe, P.C.

(57) ABSTRACT

The present disclosure provides a semiconductor device with a composite dielectric structure and a method for forming the semiconductor device. The semiconductor device includes a conductive contact disposed over a semiconductor substrate, and a first dielectric layer disposed over the conductive contact. A top surface of the conductive contact is exposed by an opening. The semiconductor device also includes a bottom electrode extending along sidewalls of the opening and the top surface of the conductive contact, and a top electrode disposed over the bottom electrode and separated from the bottom electrode by a dielectric structure. The dielectric structure includes a second dielectric layer and dielectric portions disposed over the second dielectric layer. The dielectric portions cover top corners of the opening and extend partially along the sidewalls of the opening.

13 Claims, 20 Drawing Sheets

SEMICONDUCTOR DEVICE WITH COMPOSITE DIELECTRIC STRUCTURE AND METHOD FOR FORMING THE SAME

TECHNICAL FIELD

The present disclosure relates to a semiconductor device and a method for forming the same, and more particularly, to a semiconductor device with a composite dielectric structure and a method for forming the same.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies, such as short circuit and leakage current between neighboring conductive features. Accordingly, there is a continuous need to improve the manufacturing process of semiconductor devices so that the problems can be addressed.

This Discussion of the Background section is provided for background in formation only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device is provided. The semiconductor device includes a conductive contact disposed over a semiconductor substrate, and a first dielectric layer disposed over the conductive contact. A top surface of the conductive contact is exposed by an opening. The semiconductor device also includes a bottom electrode extending along sidewalls of the opening and the top surface of the conductive contact, and a top electrode disposed over the bottom electrode and separated from the bottom electrode by a dielectric structure. The dielectric structure includes a second dielectric layer and dielectric portions disposed over the second dielectric layer. The dielectric portions cover top corners of the opening and extend partially along the sidewalls of the opening.

In an embodiment, a bottom surface of each of the dielectric portions in the opening is higher than a bottom surface of the top electrode in the opening. In an embodiment, an upper portion of the top electrode in the opening is in direct contact with the dielectric portions, and a lower portion of the top electrode in the opening is in direct contact with the second dielectric layer. In an embodiment, a top surface of the first dielectric layer is higher than a top surface of the bottom electrode. In an embodiment, the top surface of the bottom electrode is covered by the second dielectric layer. In an embodiment, the top surface of the bottom electrode is higher than a bottom surface of each of the dielectric portions in the opening. In an embodiment, the top electrode, the dielectric portions and the second dielectric layer extend over the top surface of the first dielectric layer.

In another embodiment of the present disclosure, a semiconductor device is provided. The semiconductor device includes a conductive contact disposed over a semiconductor substrate, and a first dielectric layer disposed over the conductive contact. The semiconductor device also includes a capacitor penetrating through the first dielectric layer to contact a top surface of the conductive contact. The capacitor includes a bottom electrode extending along sidewalls of the first dielectric layer and the top surface of the conductive contact, and a top electrode covering the bottom electrode and extending over the first dielectric layer. The capacitor also includes a dielectric structure separating the top electrode from the bottom electrode and the first dielectric layer. The dielectric structure includes a second dielectric layer and dielectric portions disposed over the second dielectric layer, and the dielectric portions are located at top corners of the first dielectric layer.

In an embodiment, the second dielectric layer covers the bottom electrode and extends over the first dielectric layer, and the top electrode is in direct contact with the second dielectric layer. In an embodiment, a first portion of the second dielectric layer is sandwiched between the dielectric portions and the first dielectric layer, and a second portion of the second dielectric layer is sandwiched between the dielectric portions and the bottom electrode. In an embodiment, a bottommost surface of each of the dielectric portions is in direct contact with the top electrode. In an embodiment, a top surface of the bottom electrode is higher than the bottommost surface of each of the dielectric portions. In an embodiment, the semiconductor device further includes a gate structure disposed in the semiconductor substrate, and a source/drain region disposed in the semiconductor substrate and adjacent to the gate structure. The capacitor is electrically connected to the source/drain region through the conductive contact.

In yet another embodiment of the present disclosure, a method for forming a semiconductor device is provided. The method includes forming a conductive contact over a semiconductor substrate, and forming a first dielectric layer covering the conductive contact. The method also includes partially removing the first dielectric layer to form an opening exposing a top surface of the conductive contact, and forming a bottom electrode covering sidewalls of the opening and the top surface of the conductive contact. The method further includes depositing a second dielectric layer over the bottom electrode using a first process, and depositing dielectric portions over the second dielectric layer and at top corners of the opening using a second process. The first process has a first step coverage, the second process has a second step coverage, and the second step coverage is smaller than the first step coverage. In addition, the method includes forming a top electrode covering the second dielectric layer and the dielectric portions.

In an embodiment, the first process includes a conformal deposition process, and the second process includes a conformal deposition process. In an embodiment, the second process includes a non-conformal liner atomic layer deposition (NOLA) process. In an embodiment, the second dielectric layer is partially exposed in the opening after the dielectric portions are deposited. In an embodiment, a top surface of the first dielectric layer is covered by a portion of the second dielectric layer, and the portion of the second dielectric layer is exposed after the dielectric portions are deposited. In an embodiment, forming the bottom electrode includes depositing a bottom electrode material over a top surface of the first dielectric layer, the sidewalls of the opening and the top surface of the conductive contact, and forming a sacrificial material over the bottom electrode material, wherein the opening is filled by the sacrificial material. In addition, forming the bottom electrode also includes etching the sacrificial material to expose a portion of the bottom electrode material covering the sidewalls of the opening. In an embodiment, forming the bottom electrode further includes removing the portion of the bottom electrode material to partially expose the sidewalls of the opening, and removing a remaining portion of the sacrificial material after the sidewalls of the opening are partially exposed.

Embodiments of a semiconductor device and method for forming the same are provided in the disclosure. In some embodiments, the semiconductor device includes a first dielectric layer disposed over a conductive contact, and a top surface of the conductive contact is exposed by an opening. The semiconductor device also includes a bottom electrode extending along sidewalls of the opening and the top surface of the conductive contact, a top electrode disposed over the bottom electrode and separated from the bottom electrode by a dielectric structure. The dielectric structure includes a second dielectric layer and dielectric portions disposed over the second dielectric layer. Since the dielectric structures cover top corners of the opening and extend partially a long the sidewalls of the opening, the overall thickness of the dielectric structure at the top corners of the opening may be increased. This may prevent or reduce leakage current between the top electrode and the bottom electrode. As a result, the device performance may be enhanced.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
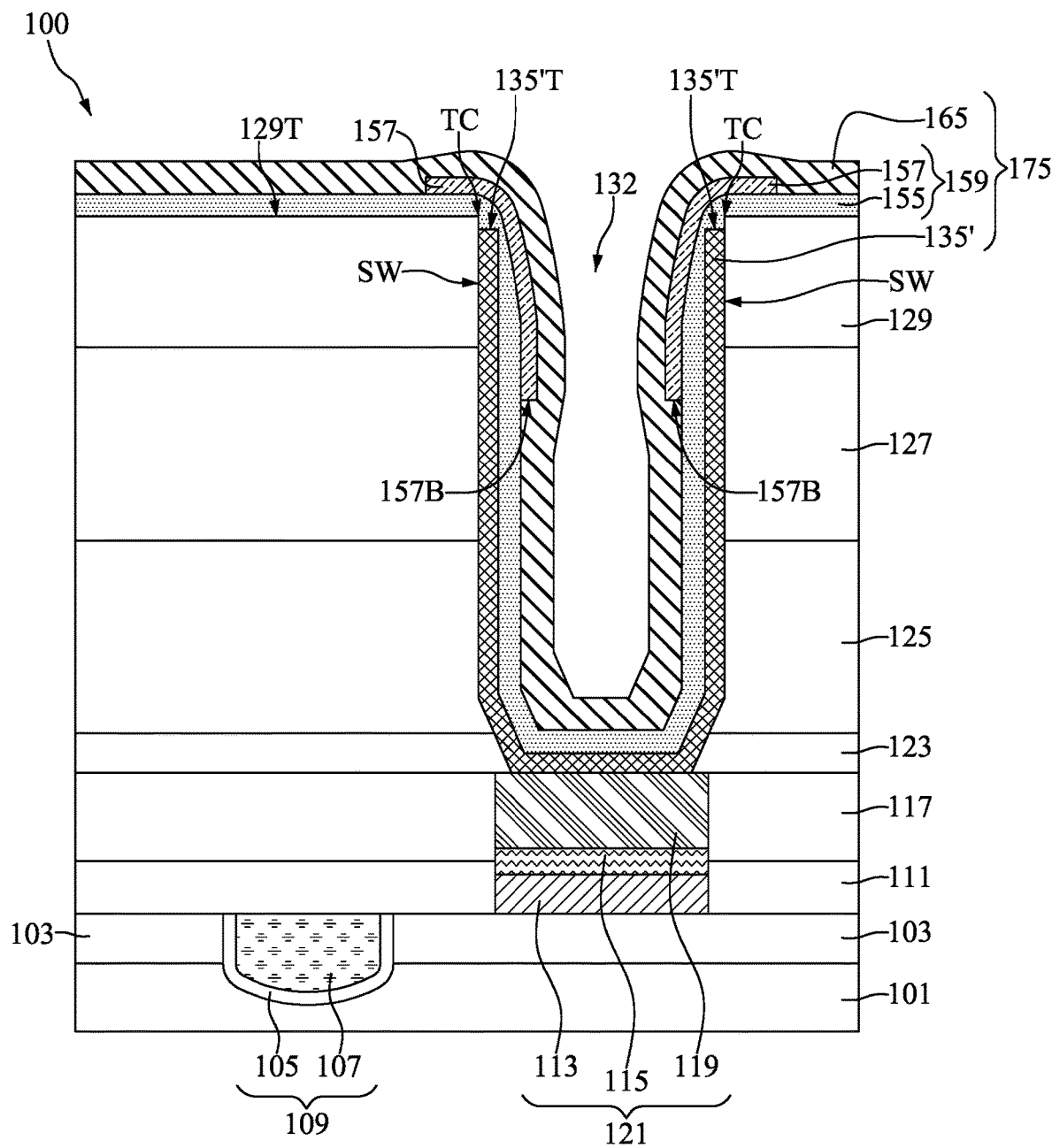
FIG. 1 is a cross-sectional view illustrating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device 100, in accordance with some embodiments. In some embodiments, the semiconductor device 100 includes a semiconductor substrate 101, and a gate structure 109 and source/drain regions 103 disposed in the semiconductor substrate 101. The gate structure 109 includes a gate dielectric layer 105 and a gate electrode 107 separating from the semiconductor substrate 101 by the gate dielectric layer 105. The source/drain regions 103 are disposed at opposite sides of the gate structure 109. In some embodiments, the semiconductor device 100 is part of dynamic random access memory (DRAM), and the gate structure 109 is a buried word line (WL) structure.

In some embodiments, the semiconductor device 100 also includes a dielectric layer 111 disposed over the semiconductor substrate 101, a dielectric layer 117 disposed over the dielectric layer 111, and a conductive contact 121 penetrating through the dielectric layers 111 and 117 to contact one of the source/drain regions 103. The conductive contact 121 includes a lower conductive portion 113, an upper conductive portion 119 and a silicide portion 115 disposed between the lower conductive portion 113 and the upper conductive port ion 119.

In some embodiments, the semiconductor device 100 further includes a plurality of dielectric layers 123, 125, 127 and 129 disposed over the dielectric layer 117. In some embodiments, the conductive contact 121 is exposed by an opening 132 penetrating through the dielectric layers 123, 125, 127 and 129. In addition, the semiconductor device 100 includes a capacitor 175 disposed in the opening 132 and electrically connected to the underlying source/drain region 103 through the conductive contact 121. In some embodiments, the capacitor 175 extends over the top surface 129T of the dielectric layer 129.

Still referring to FIG. 1, in some embodiments, the capacitor 175 includes a bottom electrode 135' extending along the sidewalls SW of the opening 132 (i.e., the sidewalls of the dielectric layers 129, 127, 125 and 123 exposed by the opening 132) and contacting the conductive contact 121, a top electrode 165 disposed over the bottom electrode 135' and a dielectric structure 159 separating the top electrode 165 and the bottom electrode 135'. In some embodiments, both the top electrode 165 and the dielectric structure 150 further extend over the top surface 129T of the dielectric layer 129. In some embodiments, the dielectric structure 159 includes a dielectric layer 155 and dielectric portions 157 disposed over the dielectric layer 155. It should be noted that the dielectric portions 157 of the dielectric structure 159 are located at the top corners TC of the opening 132.

In some embodiments, the dielectric portions 157 extend partially along the sidewalls SW of the opening 132, such that the upper portion of the top electrode 165 in the opening 132 is in direct contact with the dielectric portions 157 and the lower portion of the top electrode 165 in the opening 132 is in direct contact with the dielectric layer 155. Moreover, in some embodiments, the top electrode 165 is in direct contact with the portion of the dielectric layer 155 over the top surface 129T of the dielectric layer 129.

Furthermore, in some embodiments, the top surface 129T of the dielectric layer 129 is higher than the top surface 135'T of the bottom electrode 135', and the top surface 135'T of the bottom electrode 135' is higher than the bottom surface 157B (i.e., the bottommost surface) of each of the dielectric portions 157 in the opening 132. In some embodiments, the bottom surface 157B of each of the dielectric portions 157 in the opening 132 is higher than the bottom surface 165B (i.e., the bottom most surface) of the top electrode 165 in the opening 132. In addition, the dielectric portions 157 partially covers the top surface 129T of the dielectric layer 129. In some embodiments, the dielectric layer 155 has a portion sandwiched between the dielectric portions 157 and the dielectric layer 129, and has another portion sandwiched between the dielectric portions 157 and the bottom electrode 135'.

Figure 2:
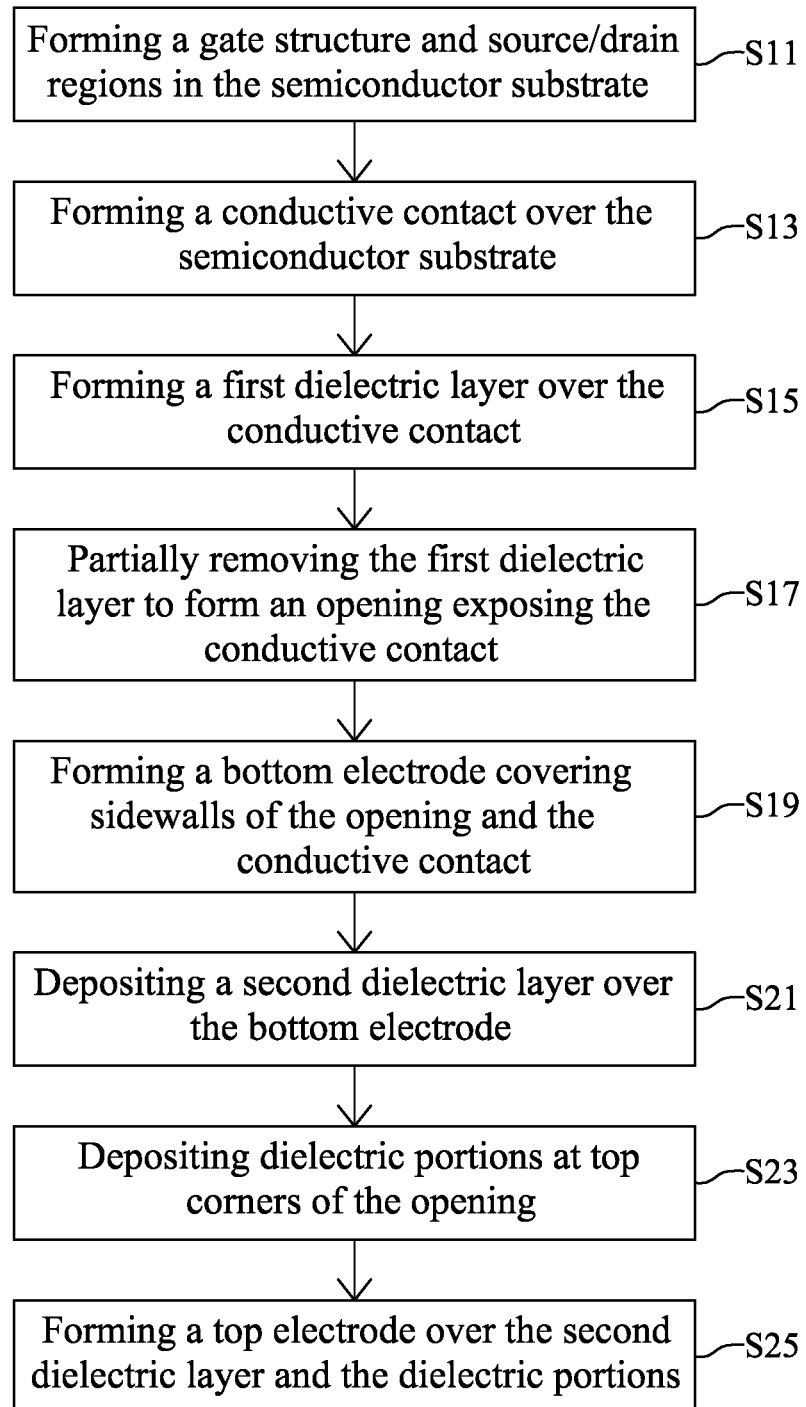
FIG. 2 is a flow diagram illustrating a method for forming a semiconductor device, in accordance with some embodiments.

FIG. 2 is a flow diagram illustrating a method 10 for forming a semiconductor device (e.g., the semiconductor device 100), and the method 10 includes steps S11, S13, S15, S17, S19, S21, S23 and S25, in accordance with some embodiments. The steps S11 to S25 of FIG. 2 are elaborated in connect ion with the following figures.

Figure 3:
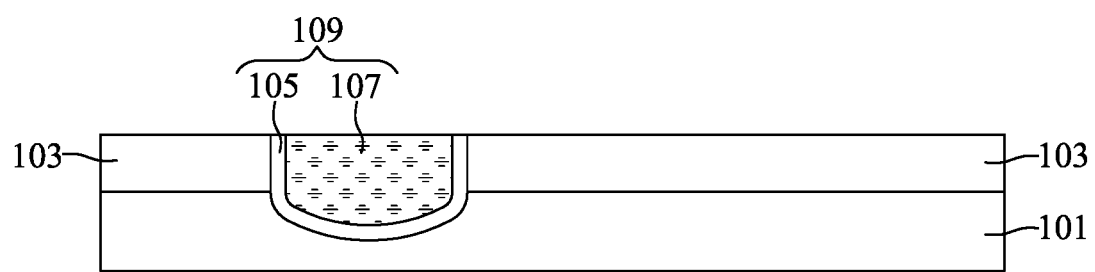
FIG. 3 is a cross-sectional view illustrating an intermediate stage of forming a gate structure and source/drain regions in a semiconductor substrate during the formation of the semiconductor device, in accordance with some embodiments.

FIGS. 3-20 are cross-sectional views illustrating intermediate stages during the formation of the semiconductor device 100, in accordance with some embodiments. As shown in FIG. 3, the semiconductor substrate 101 is provided. The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates may be fabricated using separation by implantation of oxygen (SIMOX), wafer bonding , and/or other applicable methods.

Still referring to FIG. 3, the source/drain regions 103 and the gate structure 109 are formed in the semiconductor substrate 101. The respective step is illustrated as the step S11 in the method 10 shown in FIG. 2. One or more isolation structures (not shown) may be formed in the semiconductor substrate 101 to define active areas. The source/drain regions 103 may be formed by one or more ion implantation processes, and P-type dopants, such as boron (B), gallium (Ga), or indium (In), or N-type dopants, such as phosphorous (P) or arsenic (As), can be implanted in the active areas defined by the isolation structure(s) to form t he source/drain regions 103, depending on the conductivity type of the semiconductor device 100.

The gate structure 109 includes the gate electrode 107 and the gate dielectric layer 105 surrounding the gate electrode 107. The gate dielectric layer 105 may include silicon oxide, silicon nitride, silicon oxynitride, a dielectric material with high dielectric constant (high-k), or a combination thereof, and the gate electrode 107 may include a conductive material such as aluminum (Al), copper (Cu), tungsten (W), titanium (Ti), tantalum (Ta), or may be a multi-layer structure including any combination of the above materials. The formation of the gate structure 109 may include etching the semiconductor substrate 101 to form a trench, depositing a gate dielectric material (not shown) lining the trench and covering the top surface of the semiconductor substrate , depositing a gate electrode material (not shown) in a remaining portion of the trench and over the top surface of the semiconductor substrate, and performing a planarization process on the gate dielectric material and the gate electrode material. The deposition processes may include chemical vapor deposition (CVD), physical vapor deposition (PVD), atomic layer deposition (ALD), or other suitable processes. The planarization process may include a chemical mechanical polishing (CMP) process, a grinding process, an etching process, or another suitable process.

Figure 4:
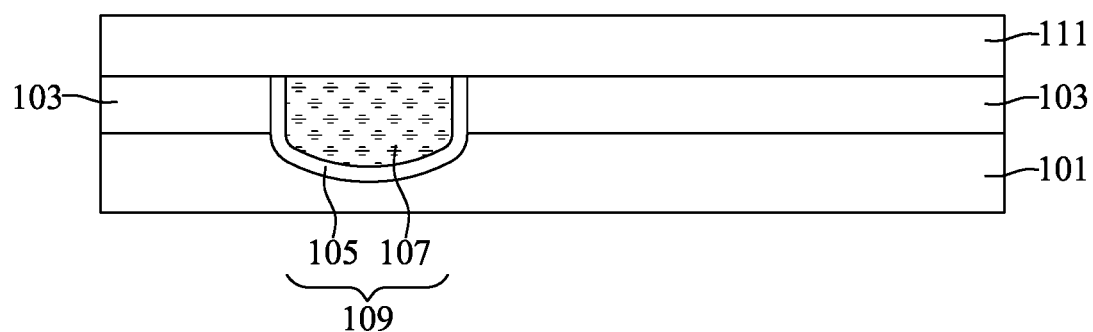
FIG. 4 is a cross-sectional view illustrating an intermediate stage of forming a dielectric layer over the semiconductor substrate during the formation of the semiconductor device, in accordance with some embodiments.

Next, the dielectric layer 111 is formed over the semiconductor substrate 101, as shown in FIG. 4 in accordance with some embodiments. In some embodiments, the source/drain regions 103 and the gate structure 109 are covered by the dielectric layer 111. In some embodiments, the dielectric layer 111 includes silicon nitride. However, other materials, such as silicide oxide, silicon oxynitride, silicon carbonitride, silicon oxide carbonitride, combinations thereof, or the like, may alternatively be used for the dielectric layer 111. In addition, the dielectric layer 111 may be formed by a deposition process, such as a CVD process, a PVD process, or an ALD process.

Figure 5:
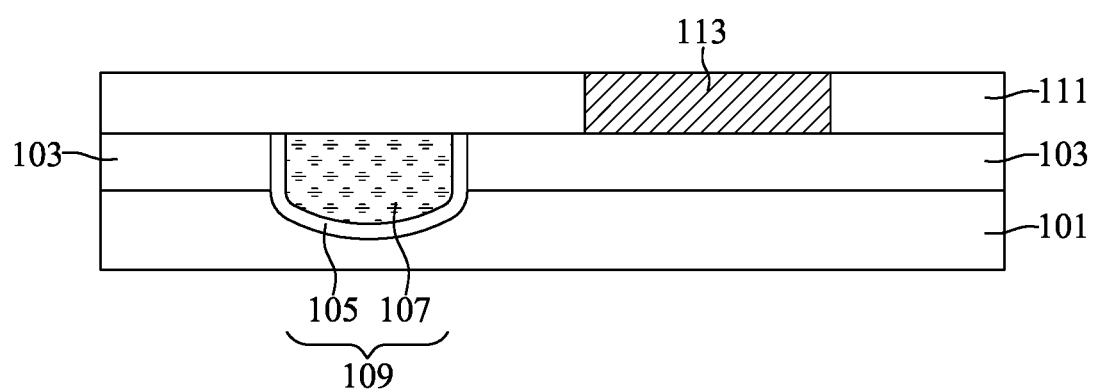
FIG. 5 is a cross-sectional view illustrating an intermediate stage of forming a lower conductive portion in the dielectric layer during the formation of the semiconductor device, in accordance with some embodiments.

Subsequently, the lower conductive portion 113 is formed in the dielectric layer 111, as shown in FIG. 5 in accordance with some embodiments. In some embodiments, the lower conductive portion 113 penetrates through the dielectric layer 111 to contact one of the source/drain regions 103. In some embodiments, the lower conductive portion 113 is formed of polysilicon, although other conductive material such as metals, metal alloys, and the like, may also be used. The formation of the lower conductive portion 113 may include etching the dielectric layer 111 to form an opening exposing one of the source/drain regions 103, depositing a conductive material (not shown) in the opening and over the top surface of the dielectric layer 111, and performing a planarization process on the conductive material. The deposition process may include CVD, PVD, ALD, or another suitable process. The planarization process may include a CMP process, a grinding process, an etching process, or another suitable process.

Figure 6:
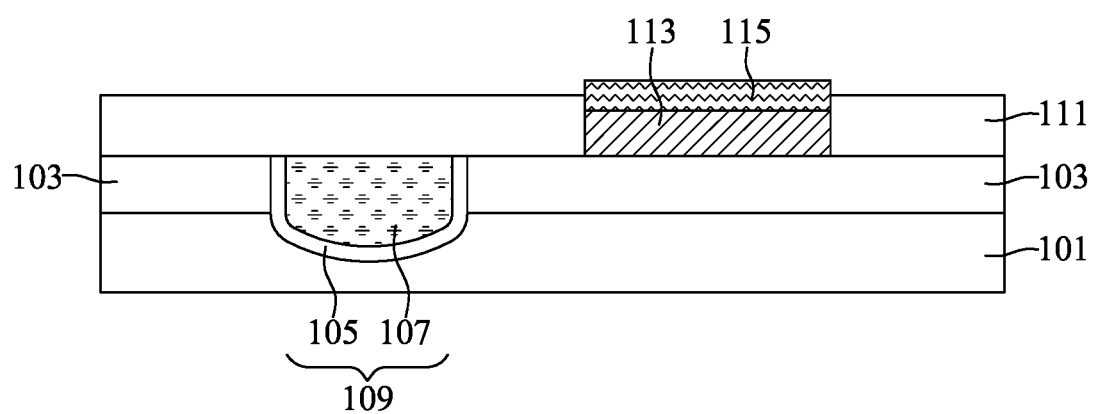
FIG. 6 is a cross-sectional view illustrating an intermediate stage of forming a silicide portion over the lower conductive portion during the formation of the semiconductor device, in accordance with some embodiments.

Then, the silicide portion 115 is formed over the lower conductive portion 113 by a silicidation process, as shown in FIG. 6 in accordance with some embodiments. In some embodiments, the silicidation process includes a metal material deposition process and an annealing process performed in sequence. The deposition process of the silicidation process may include CVD, PVD, ALD, or another suitable process. After the annealing process, the unreacted portion of the metal material may be removed.

Figure 7:
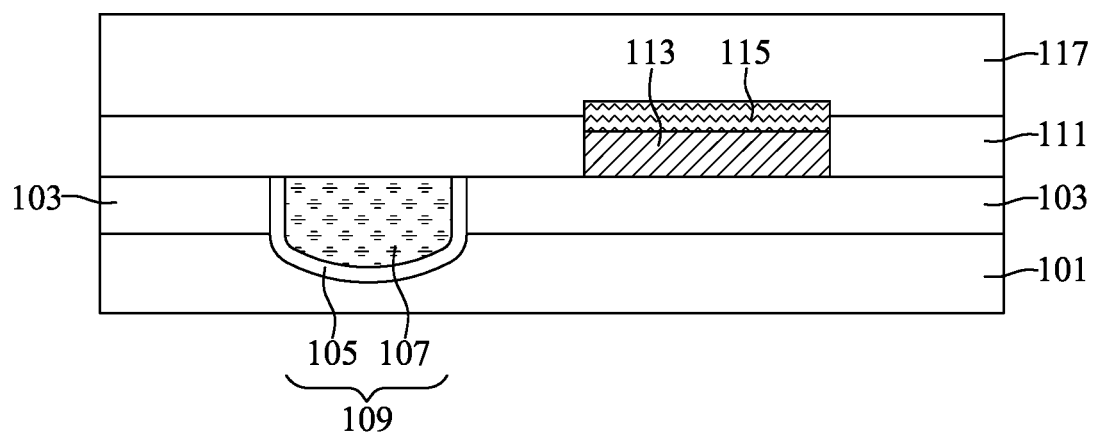
FIG. 7 is a cross-sectional view illustrating an intermediate stage of forming a dielectric layer covering the silicide portion during the formation of the semiconductor device, in accordance with some embodiments.

Next, the dielectric layer 117 is formed over the dielectric layer 111 and covering the silicide portion 115, as shown in FIG. 7 in accordance with some embodiments. In some embodiments, the dielectric layer 117 includes silicon nitride. However, other materials, such as silicide oxide, silicon oxynitride, silicon carbonitride, silicon oxide carbonitride, combinations thereof, or the like, may alternatively be used for the dielectric layer 117. In addition, the dielectric layer 117 may be formed by a deposition process, such as a CVD process, a PVD process, or an ALD process.

Figure 8:
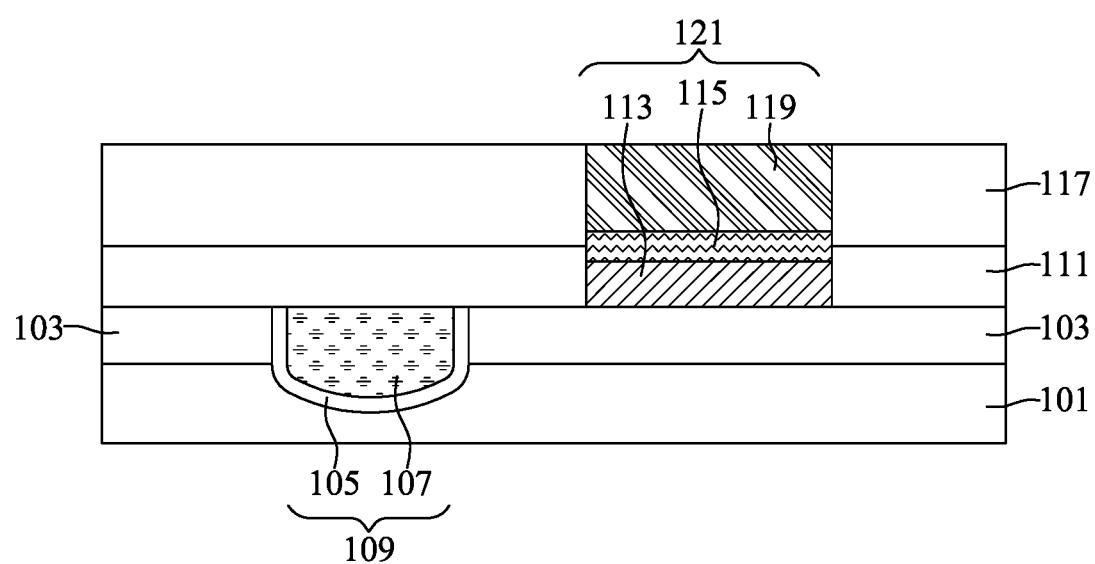
FIG. 8 is a cross-sectional view illustrating an intermediate stage of forming an upper conductive portion in the dielectric layer during the formation of the semiconductor device, in accordance with some embodiments.

Subsequently, the upper conductive portion 119 is formed in the dielectric layer 117, as shown in FIG. 8 in accordance with some embodiments. In some embodiments, the upper conductive portion 119 is formed over and in direct contact with the silicide portion 115. After the upper conductive portion 119 is formed, the conductive contact 121 including the lower conductive portion 113, the silicide portion 115 and the upper conductive portion 119 is obtained. The respective step is illustrated as the step S13 in the method 10 shown in FIG. 2.

The formation of the upper conductive portion 119 may include etching the dielectric layer 117 to form an opening exposing the silicide portion 115, depositing a conductive material (not shown) in the opening and over the top surface of the dielectric layer 117, and performing a planarization process on the conductive material. The deposition process may include CVD, PVD, ALD, or another suitable process. The planarization process may include a CMP process, a grinding process, an etching process, or another suitable process.

Figure 9:
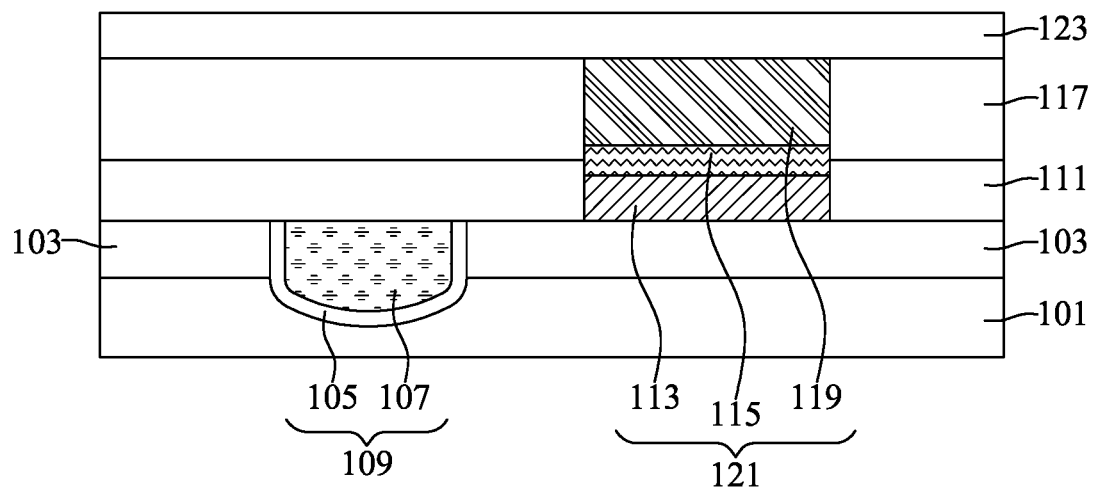
FIG. 9 is a cross-sectional view illustrating an intermediate stage of forming a dielectric layer covering the upper conductive portion during the formation of the semiconductor device, in accordance with some embodiments.

After the conductive contact 121 is formed, the dielectric layer 123 is formed over the dielectric layer 117 and covering the upper conductive portion 119 of the conductive contact 121, as shown in FIG. 9 in accordance with some embodiments. In some embodiments, the dielectric layer 123 includes silicon nitride. However, other materials, such as silicide oxide, silicon oxynitride, silicon carbonitride, silicon oxide carbonitride, combinations thereof, or the like, may alternatively be used for the dielectric layer 123. In addition, the dielectric layer 123 may be formed by a deposition process, such as a CVD process, a PVD process, or an ALD process.

Figure 10:
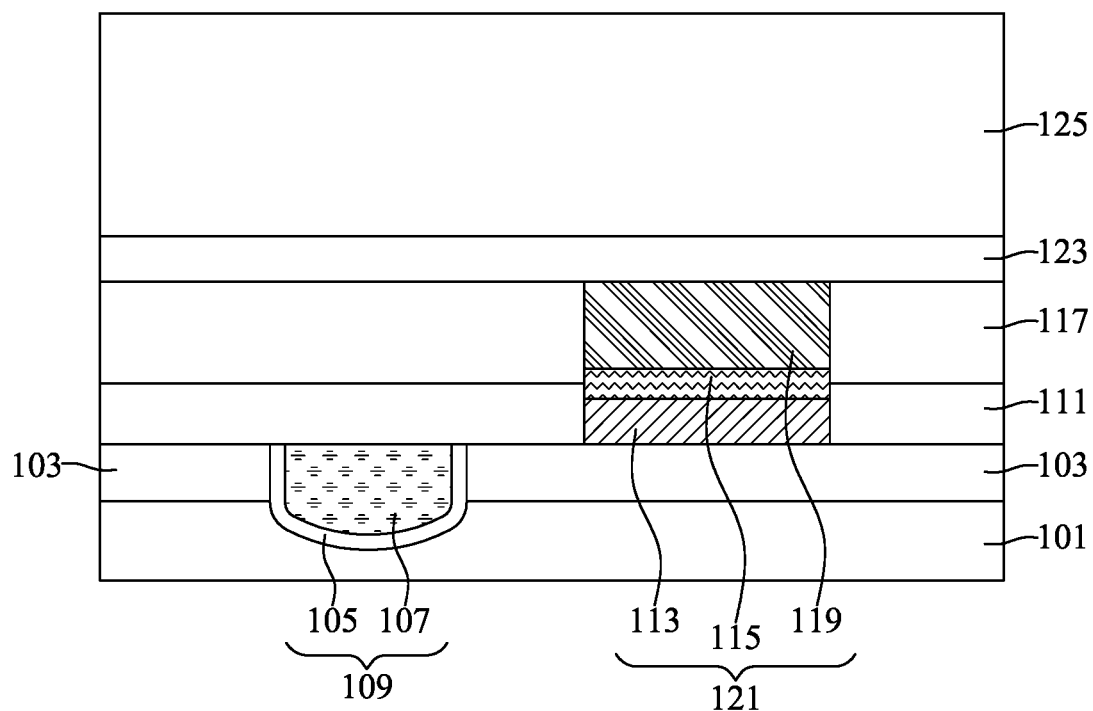
FIG. 10 is a cross-sectional view illustrating an intermediate stage of forming a dielectric layer over the upper conductive portion during the formation of the semiconductor device, in accordance with some embodiments.

Then, the dielectric layer 125 is formed over the dielectric layer 123, as shown in FIG. 10 in accordance with some embodiments. In some embodiments, the dielectric layer 125 includes an oxide, such as silicon oxide, boron-doped phosphosilicate glass (BPSG), or the like. However, other materials, such as phosphosilicate glass (PSG), borosilicate glass (BSG), silicon nitride, combinations thereof, or the like, may alternatively be used for the dielectric layer 125. In addition, the dielectric layer 125 may be formed by a deposition process, such as a CVD process, a PVD process, or an ALD process. After the deposition process for forming the dielectric layer 125, an annealing process and a planarization process may be sequentially performed. The planarization process may include a CMP process, a grinding process, an etching process, or another suitable process.

Figure 11:
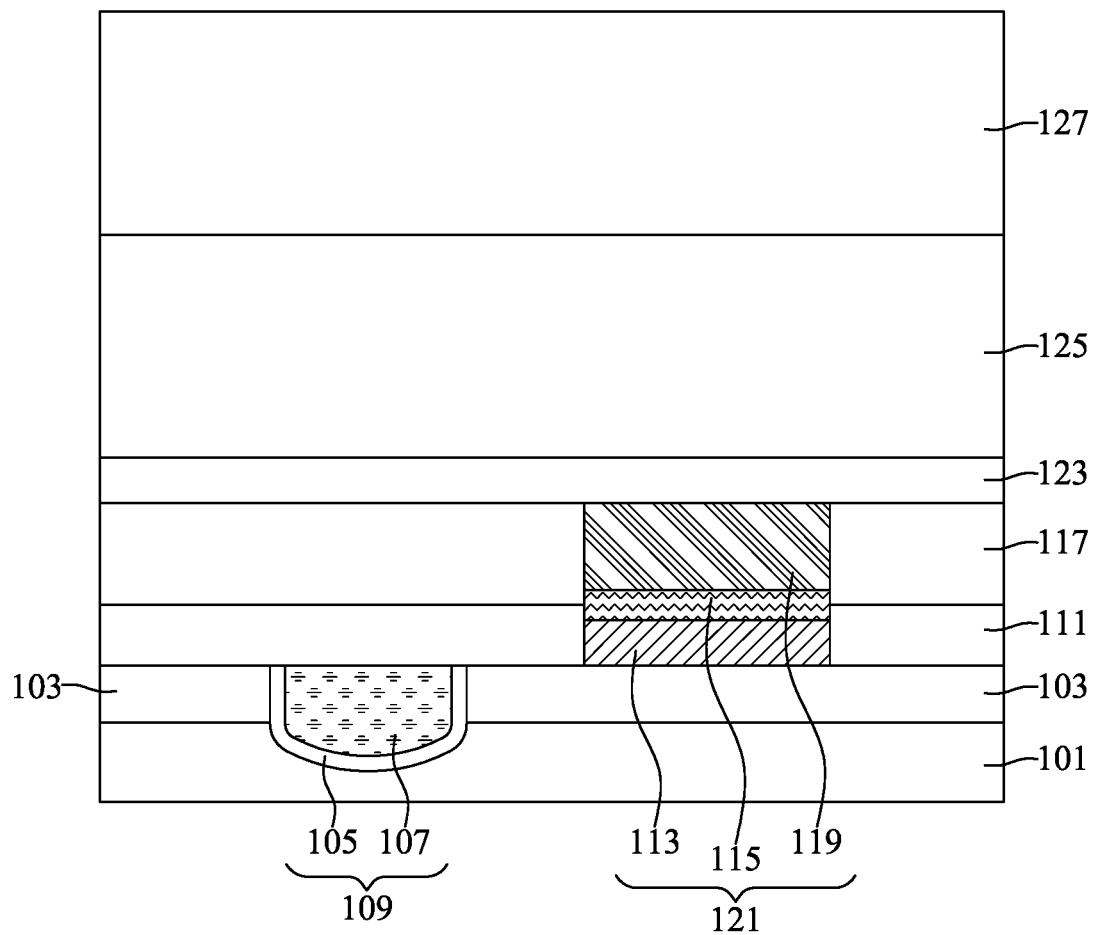
FIG. 11 is a cross-sectional view illustrating an intermediate stage of forming another dielectric layer over the upper conductive portion during the formation of the semiconductor device, in accordance with some embodiments.

Next, the dielectric layer 127 is formed over the dielectric layer 125, as shown in FIG. 11 in accordance with some embodiments. In some embodiments, the dielectric layer 127 includes an oxide, such as silicon oxide, tetraethyl orthosilicate (TEOS) oxide, BPSG, or a combination thereof. However, other materials, such as PSG, BSG, silicon nitride, combinations thereof, or the like, may alternatively be used for the dielectric layer 127. In addition, the dielectric layer 127 may be formed by a deposition process, such as a CVD process, a PVD process, or an ALD process.

Figure 12:
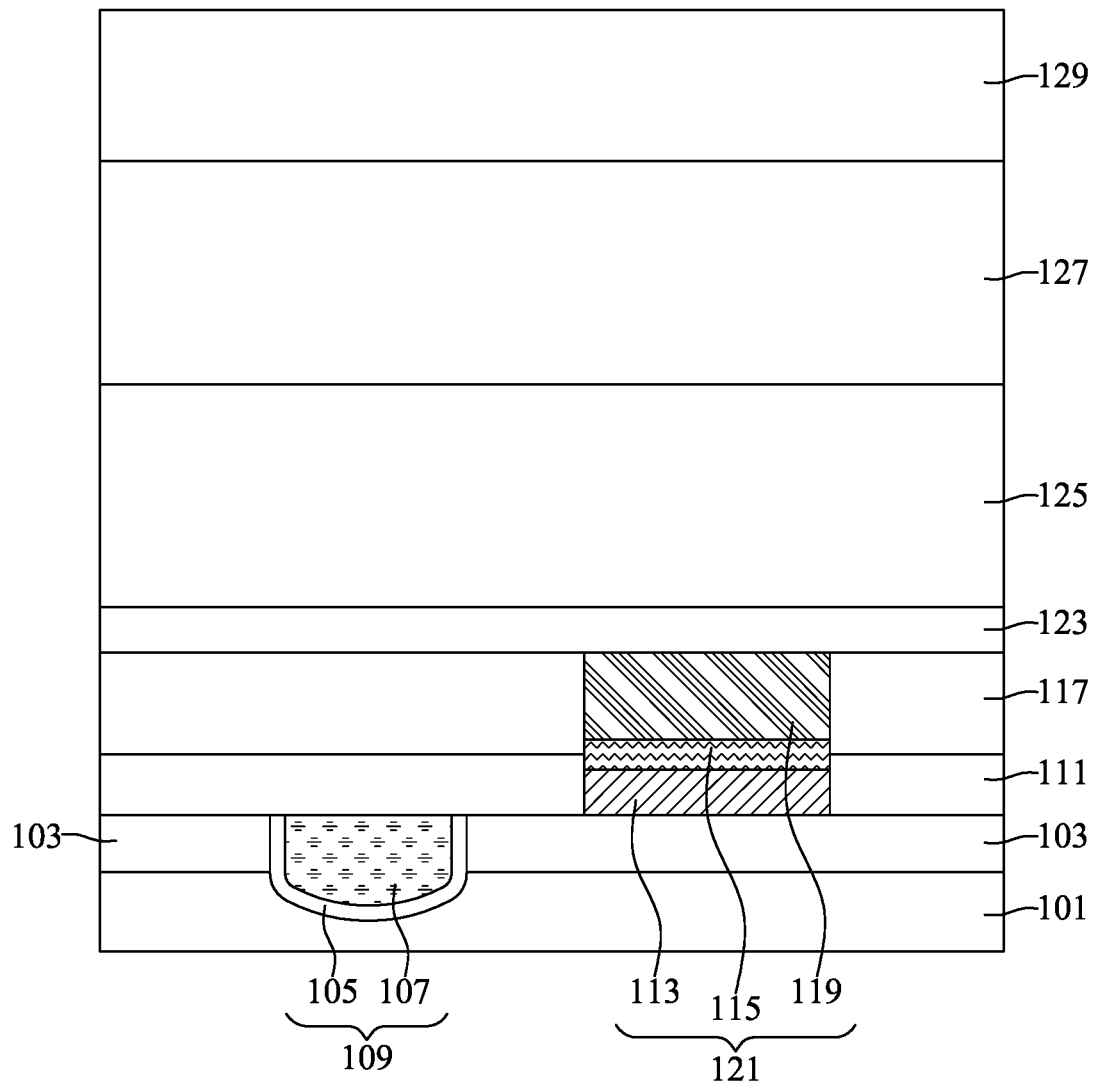
FIG. 12 is a cross-sectional view illustrating an intermediate stage of forming another dielectric layer over the upper conductive portion during the formation of the semiconductor device, in accordance with some embodiments.

Subsequently, the dielectric layer 129 is formed over the dielectric layer 127, as shown in FIG. 12 in accordance with some embodiments. The respective step is illustrated as the step S15 in the method 10 shown in FIG. 2. In some embodiments, the dielectric layer 129 includes silicon nitride. However, other materials, such as silicide oxide, silicon oxynitride, silicon carbonitride, silicon oxide carbonitride, combinations thereof, or the like, may alternatively be used for the dielectric layer 129. In addition, the dielectric layer 129 may be formed by a deposition process, such as a CVD process, a PVD process, or an ALD process.

Figure 13:
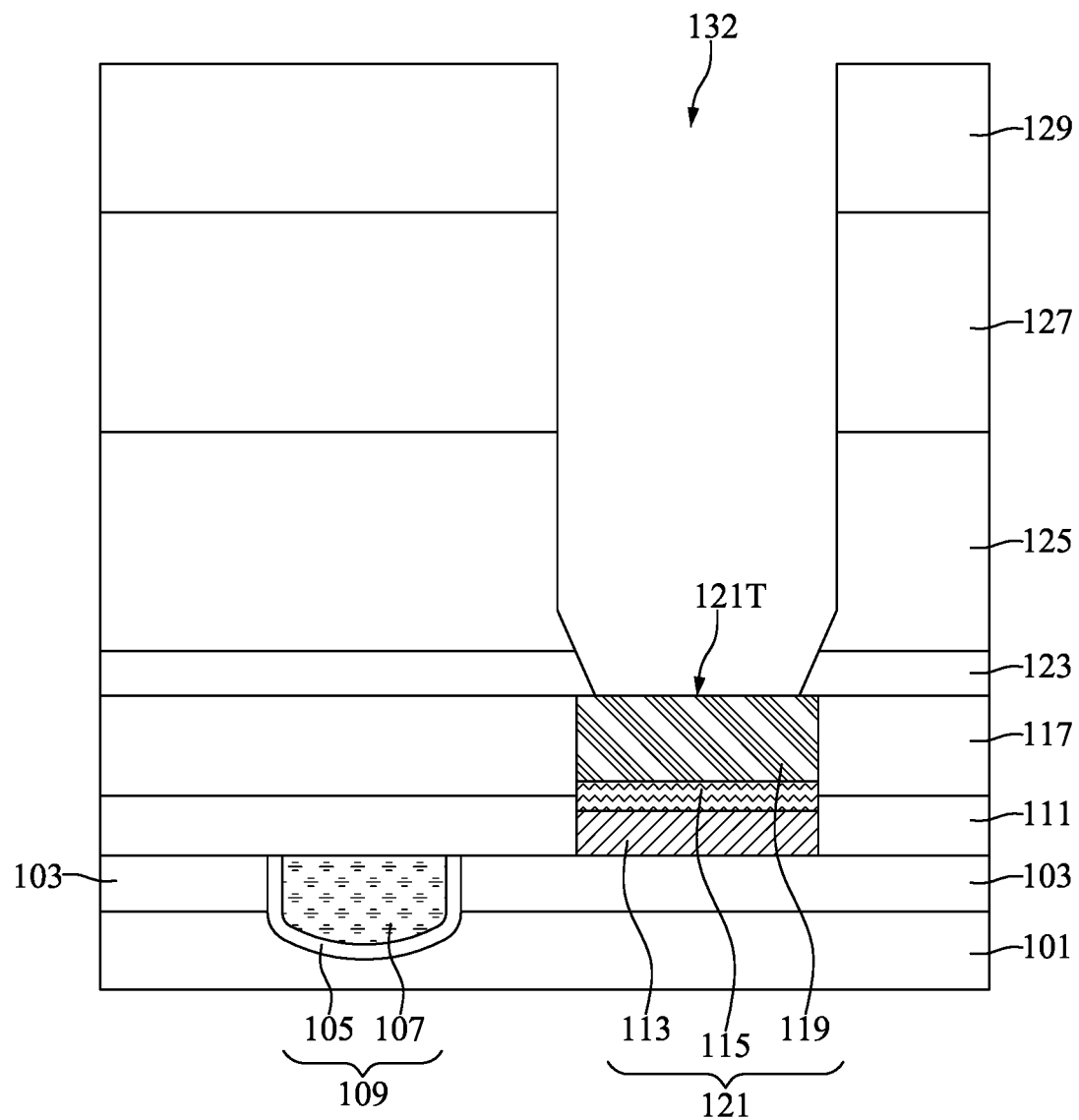
FIG. 13 is a cross-sectional view illustrating an intermediate stage of forming an opening penetrating through the dielectric layers over the upper conductive portion during the formation of the semiconductor device, in accordance with some embodiments.

After the dielectric layer 129 is formed, an etching process is performed to form the opening 132 exposing the top surface 121T of the conductive contact 121 (i.e., the top surface of the upper conductive portion 119), as shown in FIG. 13 in accordance with some embodiments. The respective step is illustrated as the step S17 in the method 10 shown in FIG. 2. In some embodiments, the opening 132 penetrates through the dielectric layers 129, 127, 125 and 123. In some embodiments, the top surface 121T of the conductive contact 121 is partially exposed by the opening 132. In some embodiments, the etching process includes a dry etching process.

Figure 14:
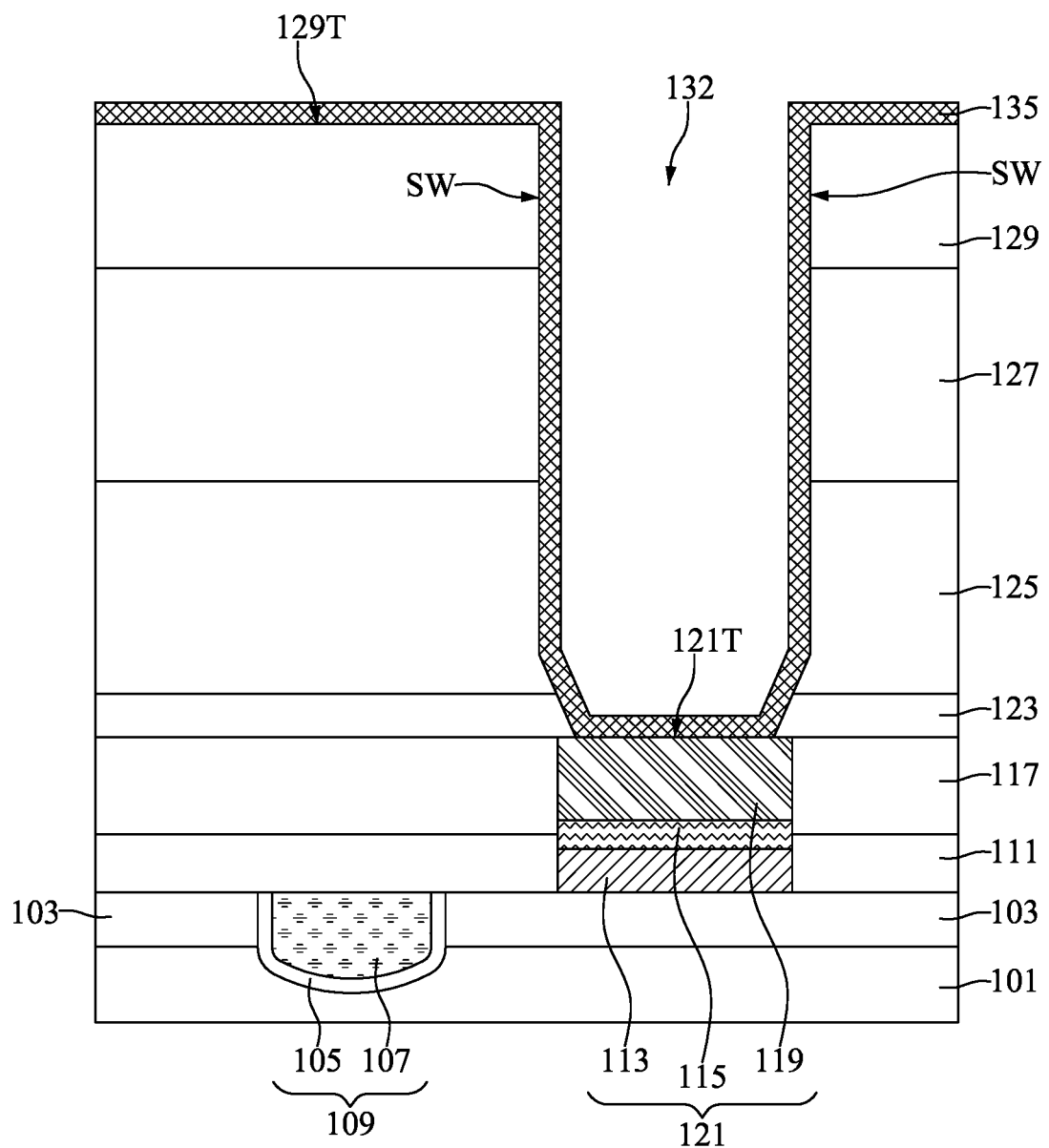
FIG. 14 is a cross-sectional view illustrating an intermediate stage of forming a bottom electrode material during the formation of the semiconductor device, in accordance with some embodiments.

Then, a bottom electrode material 135 is conformally formed over the dielectric layer 129 and lining the opening 132, as shown in FIG. 14 in accordance with some embodiments. Specifically, the bottom electrode material 135 extends along the top surface 129T of the dielectric layer 129, the sidewalls SW of the opening 132 and the top surface 121T of the conductive contact 121 exposed by the opening 132. In some embodiments, the bottom electrode material 135 includes titanium nitride (TiN), titanium silicon nitride (TiSiN), or a combination thereof In some embodiments, the bottom electrode material 135 is formed by a deposition process, such as a CVD process.

Figure 15:
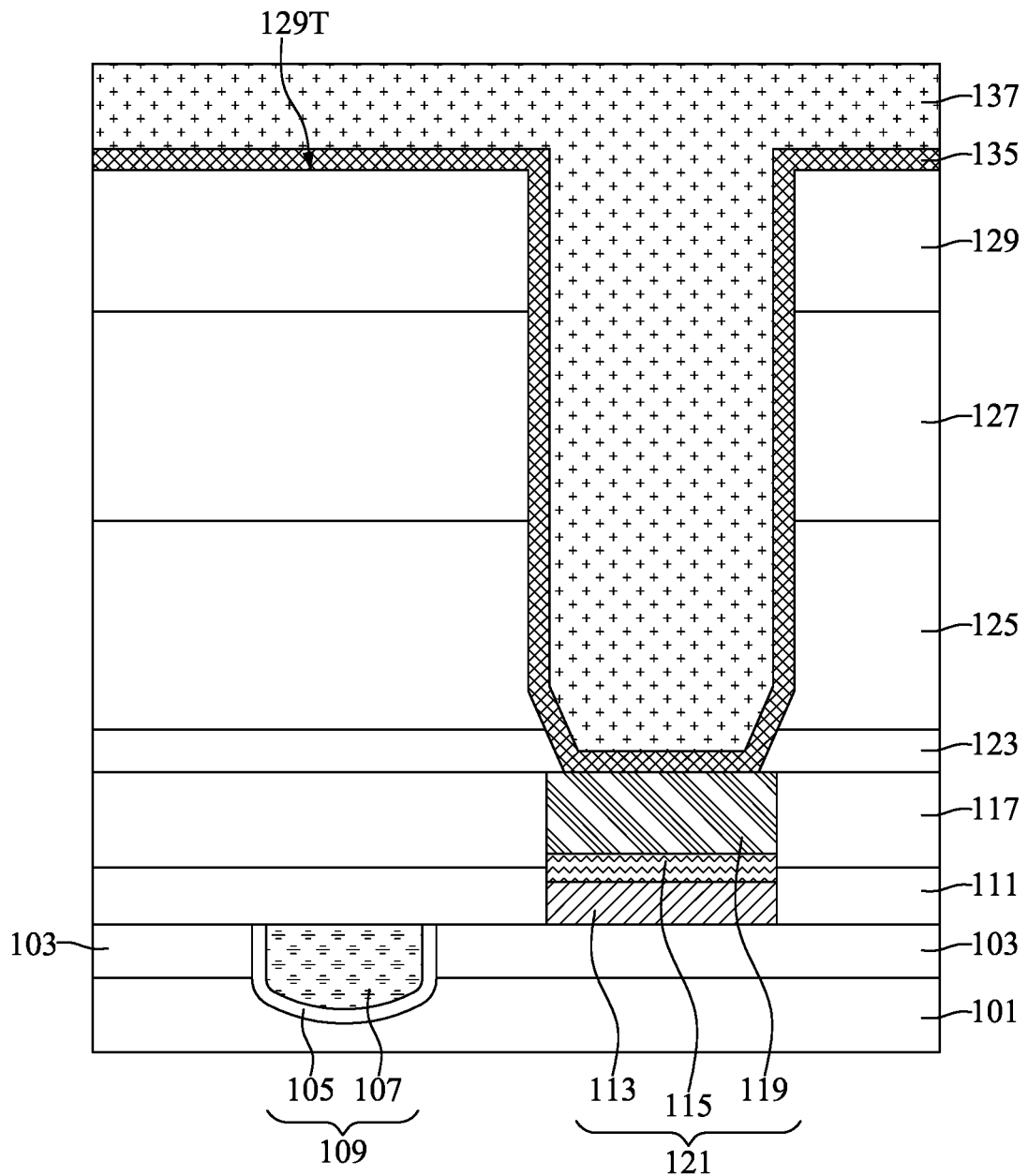
FIG. 15 is a cross-sectional view illustrating an intermediate stage of forming a sacrificial material over the bottom electrode material during the formation of the semiconductor device, in accordance with some embodiments.

Next, a sacrificial material 137 is formed over the dielectric layer 129 and filling the remaining portion of the opening 132, as shown in FIG. 15 in accordance with some embodiments. In some embodiments, the bottom electrode material 135 is completely covered by the sacrificial material 137. In some embodiments, the sacrificial material 137 includes an oxide, such as silicon oxide. However, other materials, such as silicide nitride, silicon oxynitride, silicon carbonitride, combinations thereof, or the like, may alternatively be used for the sacrificial material 137. In some embodiments, the sacrificial material 137 is formed by a deposition process, such as a CVD process, a PVD process, or an ALD process.

Figure 16:
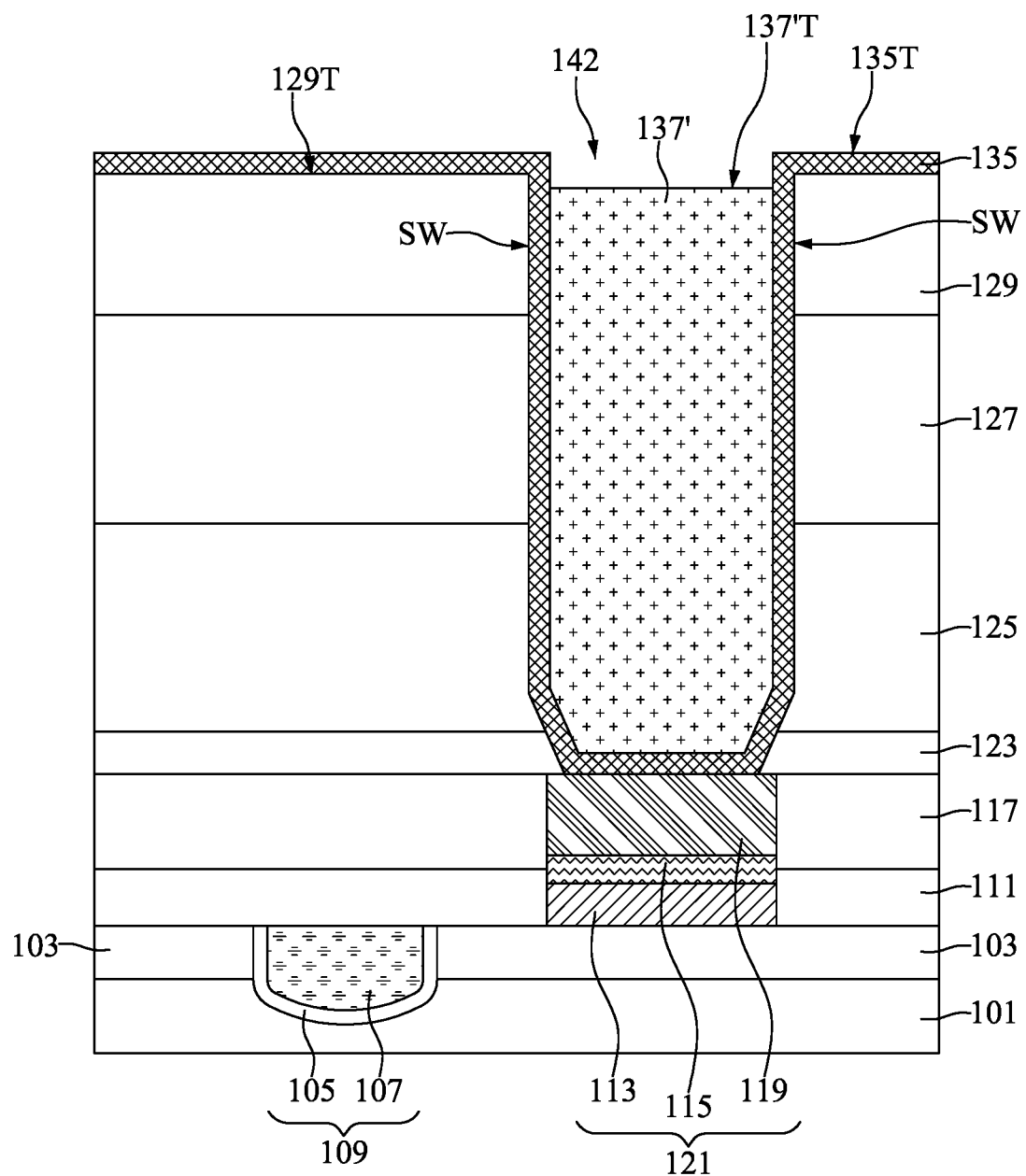
FIG. 16 is a cross-sectional view illustrating an intermediate stage of etching the sacrificial material to form a sacrificial structure in the opening during the formation of the semiconductor device, in accordance with some embodiments.

Subsequently, an etching process is performed on the sacrificial material 137 to expose the bottom electrode material 135, leaving a portion of the sacrificial material 137 in the opening 132 (see FIG. 14), which is referred to as a sacrificial structure 137', as shown in FIG. 16 in accordance with some embodiments. In the present embodiment, a portion of the sacrificial material 137 in the opening 132 is also removed such that a recess 142 is formed over the sacrificial structure 137'.

In some embodiments, the top surface 135T of the bottom electrode material 135 is higher than the top surface 137'T of the sacrificial structure 137'. In some embodiments, the top surface 129T of the dielectric layer 129 is higher than the top surface 137'T of the sacrificial structure 137'. That is, a portion of the bottom electrode material 135 covering the sidewalls SW of the opening 132 is exposed in the recess 142 over the sacrificial structure 137', in accordance with some embodiments. The etching process for forming the sacrificial structure 137' may be a wet etching process, a dry etching process, or a combination thereof.

Figure 17:
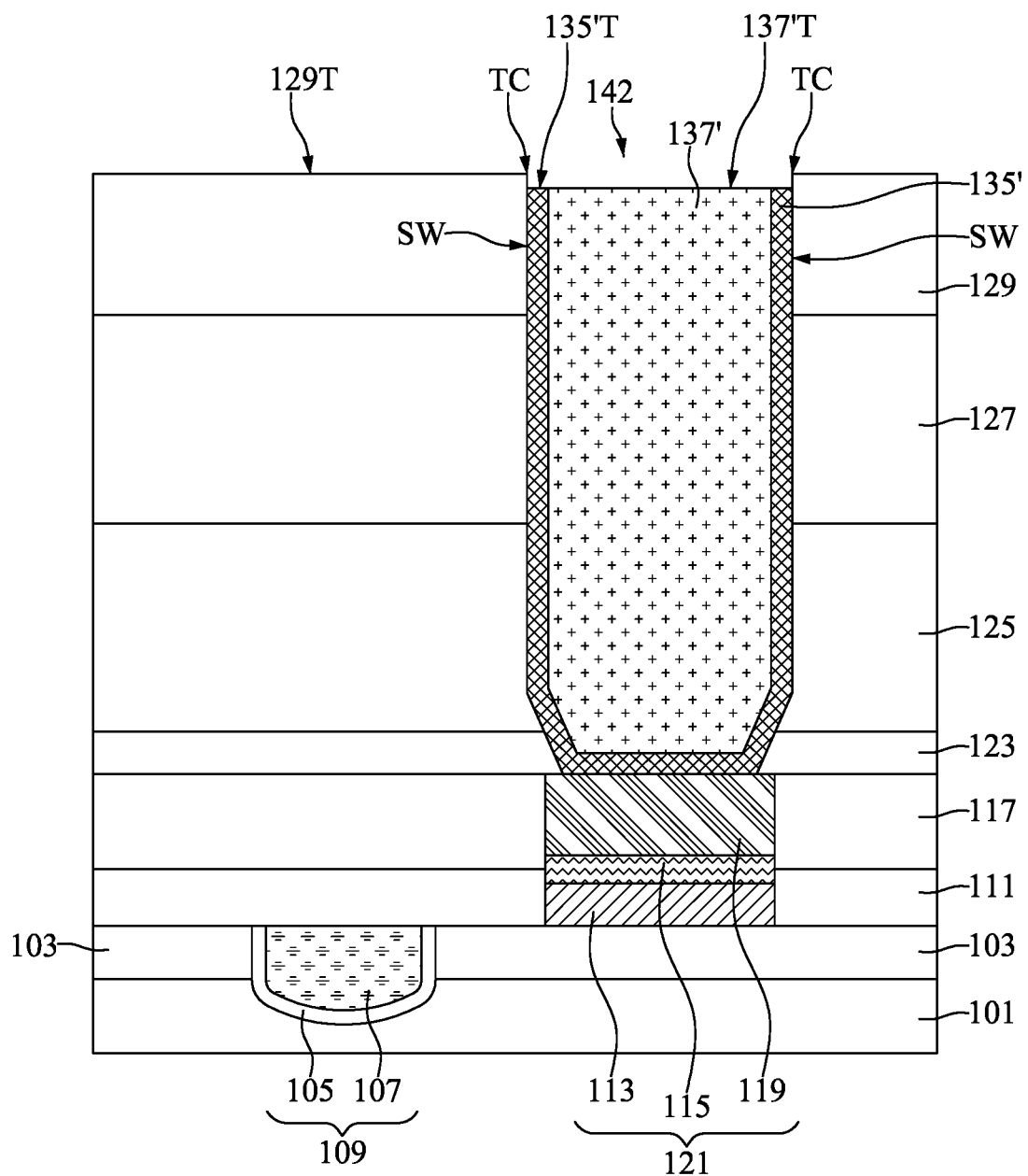
FIG. 17 is a cross-sectional view illustrating an intermediate stage of etching the bottom electrode material to form a bottom electrode in the opening during the formation of the semiconductor device, in accordance with some embodiments.

Then, an etching process is performed to remove the exposed portions of the bottom electrode material 135, leaving a portion of the bottom electrode material 135 in the opening 132 (see FIG. 14), which is referred to as the bottom electrode 135', as shown in FIG. 17 in accordance with some embodiments. The respective step is illustrated as the step S19 in the method 10 shown in FIG. 2. In some embodiments, the bottom electrode 135' covers the sidewalls SW of the opening 132 and the top surface 121T of the conductive contact 121.

In some embodiments, the portion of the bottom electrode material 135 covering the top corners TC of the opening 132 is removed, and the top surface 135'T of the bottom electrode 135' is substantially coplanar with the top surface 137'T of the sacrificial structure 137'. Within the context of this disclosure, the word "substantially" means preferably at least 90%, more preferably 95%, even more preferably 98%, and most preferably 99%. In other words, the recess 142 is laterally expanded, in accordance with some embodiments. Moreover, in some embodiments, the top surface 129T of the dielectric layer 129, and the top corners TC and the upper portion of the sidewalls SW of the opening 132 are exposed. In some embodiments, the etching process for forming the bottom electrode 135' includes one or more dry etching processes.

Figure 18:
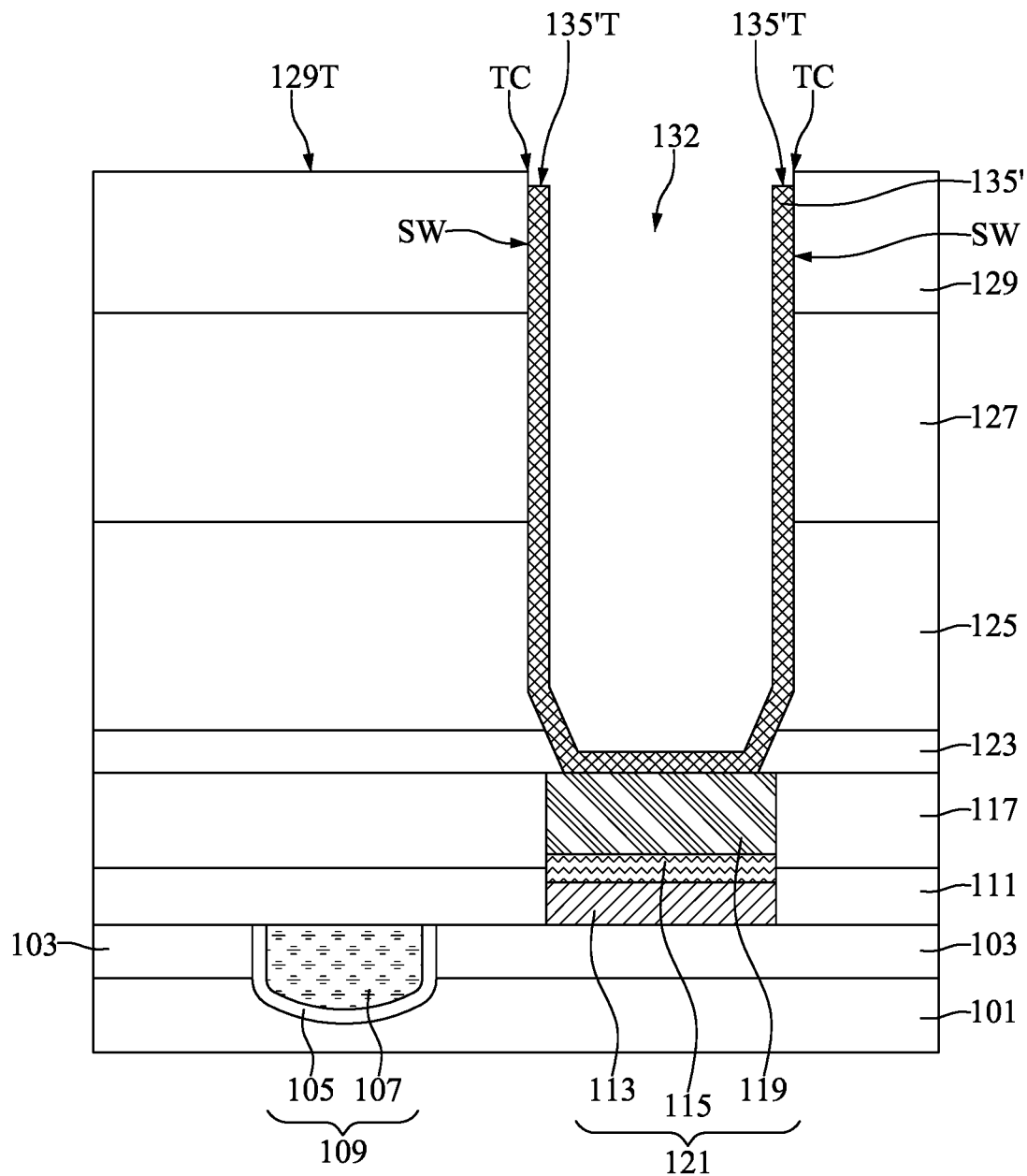
FIG. 18 is a cross-sectional view illustrating an intermediate stage of removing the sacrificial structure during the formation of the semiconductor device, in accordance with some embodiments.

Next, an etching process is performed to remove the sacrificial structure 137', as shown in FIG. 18 in accordance with some embodiments. In some embodiments, the etching selectivity of the sacrificial structure 137' with respect to the bottom electrode 135' is relatively high. Therefore, the sacrificial structure 137' is removed by the etching process while the bottom electrode 135' may be substantially left. In some embodiments, the etching process for removing the sacrificial structure 137' includes a wet etching processes.

Figure 19:
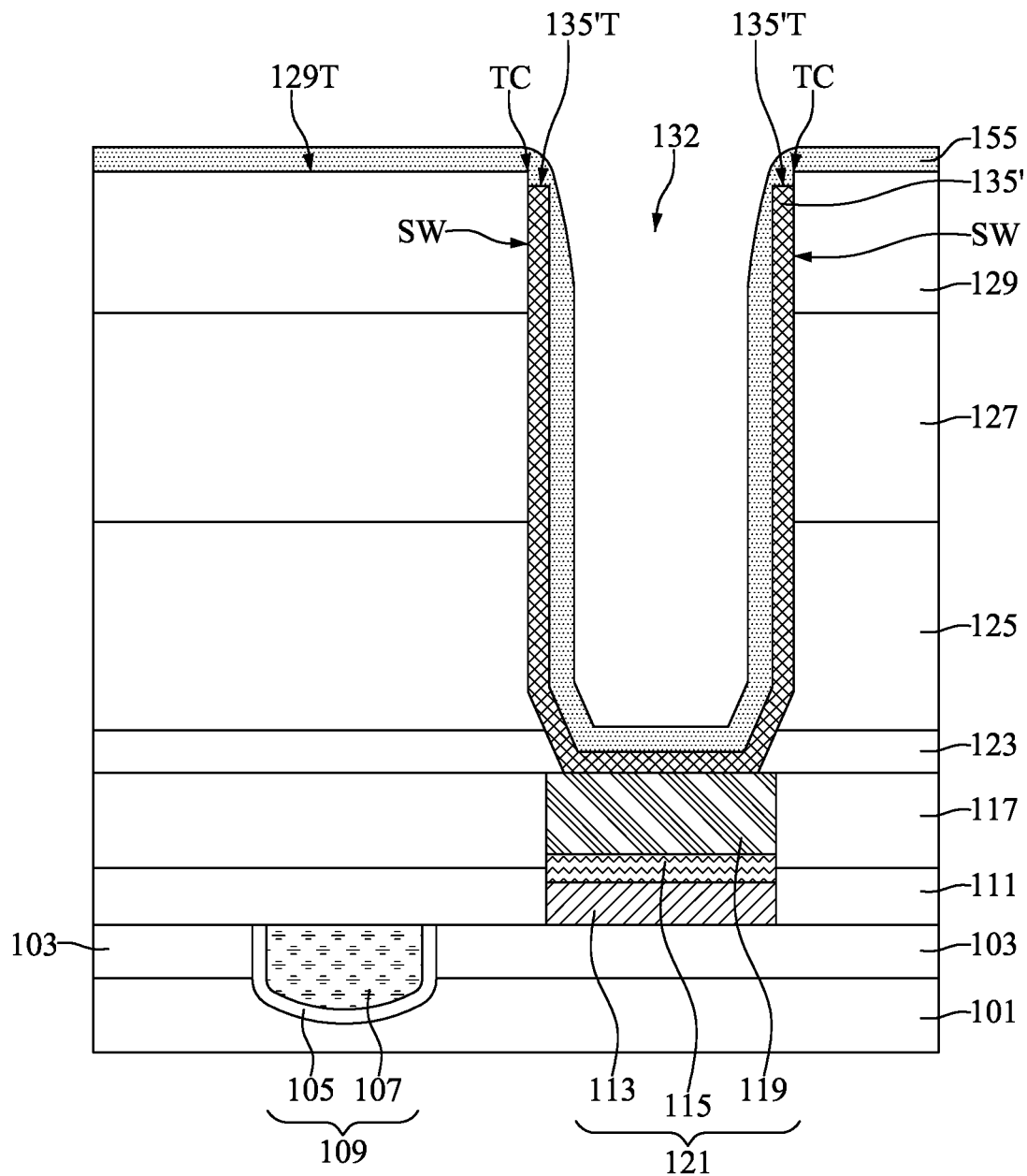
FIG. 19 is a cross-sectional view illustrating an intermediate stage of depositing a dielectric layer covering the bottom electrode during the formation of the semiconductor device, in accordance with some embodiments.

Subsequently, the dielectric layer 155 is conformally deposited over the top surface 129T of the dielectric layer 129 and covering the bottom electrode 135', as shown in FIG. 19 in accordance with some embodiments. The respective step is illustrated as the step S21 in the method 10 shown in FIG. 2. In some embodiments, the exposed top surface 129T of the dielectric layer 129 is completely covered by the dielectric layer 155. Moreover, in some embodiments, the top corners TC of the opening 132, the exposed portions of the sidewalls SW of the opening 132 and the top surface 135'T of the bottom electrode 135' are covered by the dielectric layer 155. In some embodiments, the top surface 129T of the dielectric layer 129, the top corners TC of the opening 132, the exposed portions of the sidewalls SW of the opening 132 and the top surface 135'T of the bottom electrode 135' are in direct contact with the dielectric layer 155.

In some embodiments, the dielectric layer 155 includes a single layer or multiple layers. In some embodiments, the dielectric layer 155 includes $SiO_2$, a dielectric material with high dielectric constant (high-k), such as $ZrO_2$, $HfO_2$, $TiO_2$, AlO, or a combination thereof. For example, the dielectric layer 155 may be a tri-layer structure including two layers of aluminum oxide and a layer of zirconium oxide disposed between them. Moreover, in some embodiments, the dielectric layer 155 is formed by a conformal deposition process, such as a CVD process, a PVD process, or an ALD process.

Figure 20:
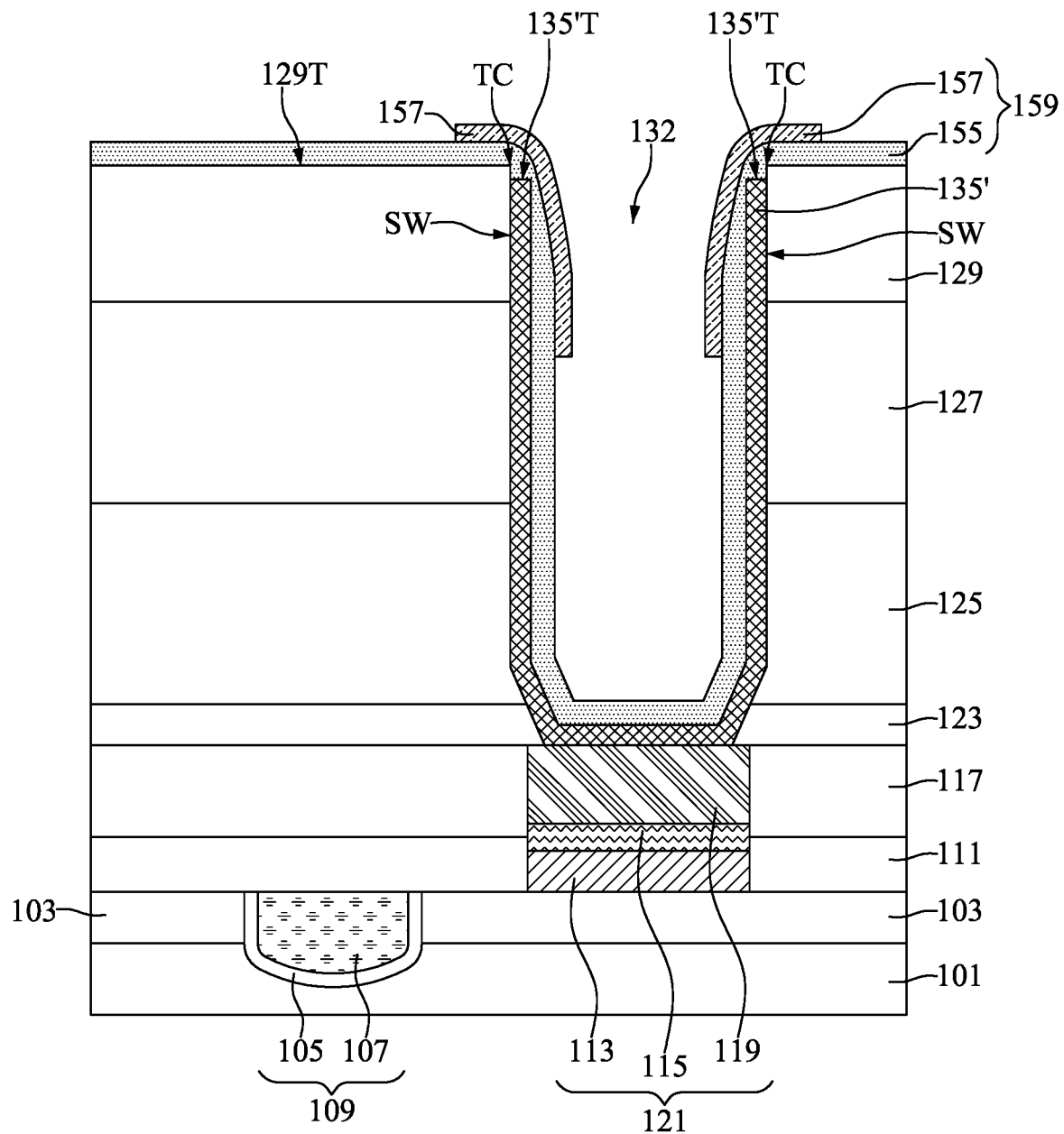
FIG. 20 is a cross-sectional view illustrating an intermediate stage of depositing dielectric portions over the dielectric layer and at top corners of the opening during the formation of the semiconductor device, in accordance with some embodiments.

Then, the dielectric portions 157 are deposited over the dielectric layer 155 and at the top corners TC of the opening 132, as shown in FIG. 20 in accordance with some embodiments. The respective step is illustrated as the step S23 in the method 10 shown in FIG. 2. In some embodiments, the dielectric layer 155 and the dielectric portions 157 collectively referred to the dielectric structure 139. It should be noted that the dielectric portions 157 are formed by a deposition process having a lower step coverage than the deposition process used for forming the dielectric layer 155. In some embodiments, the dielectric portions 157 are formed by a non-conformal deposition process, such as a non-conformal liner atomic layer deposition (NOLA) process.

After the dielectric portions 157 are formed, a portion of the dielectric layer 155 covering the top surface 129T of the dielectric layer 129 and a portion of the dielectric layer 155 in the opening 132 are exposed, in accordance with some embodiments. In some embodiments, the dielectric layer 155 has a portion sandwiched between the dielectric portions 157 and the dielectric layer 129, and has another portion sandwiched between the dielectric portions 157 and the bottom electrode 135'. In some embodiments, the dielectric portions 157 includes silicon oxide, silicon nitride, silicon oxynitride, a dielectric material with high dielectric constant (high-k), or a combination thereof.

The dielectric portions 157 are formed to prevent the corner effect, which incur uneven thickness of the dielectric layer 155. For example, the thickness of the dielectric layer 155 at the top corners TC of the open ng 132 is less than that of other portions of the dielectric layer 155. By forming the dielectric portions 157 over the dielectric layer 155, the overall thickness of the dielectric structure 159 at the top corners TC of the opening 132 may be increased, which prevent or reduce leakage current between the bottom electrode 135' and the subsequently formed top electrode 165 (see FIG. 1).

Next, the top electrode 165 is formed over the dielectric structure 159, as shown in FIG. 1 in accordance with some embodiments. In some embodiments, the top electrode 165 is conformally deposited to cover the dielectric layer 155 and the dielectric portions 157 of the dielectric structure 159. The respective step is illustrated as the step S25 in the method 10 shown in FIG. 2. In some embodiments, the bottom electrode 135', the dielectric structure 159 and the top electrode 165 collectively referred to the capacitor 175.

Specifically, the top electrode 165 extends along the top surface 129T of the dielectric layer 129, the sidewalls SW of the opening 132 and the top surface 121T of the conductive contact 121. In some embodiments, the remaining portion of the opening 132 is not formed by the top electrode 165. That is, a portion of the opening 132 located above the top electrode 165. In some embodiments, the upper portion of the top electrode 165 in the opening 132 is in direct contact with the dielectric portions 157 and the lower portion of the top electrode 165 in the opening 132 is in direct contact with the dielectric layer 155. Moreover, since the dielectric portions 157 of the dielectric structure 159 do not extend to the bottommost portion of the opening 132, the bottommost surface 157B of each of the dielectric portions 157 is higher than the bottommost surface 165B of the top electrode 165.

In some embodiments, the top electrode 165 includes titanium nitride (TiN), titanium silicon nitride (TiSiN), or a combination thereof In some embodiments, the top electrode 165 is formed by a deposition process, such as a CVD process. After the top electrode 165 of the capacitor 175 is formed, the semiconductor device 100 is obtained. In some embodiments, the semiconductor device 100 is part of dynamic random access memory (DRAM).

Embodiments of the semiconductor device 100 and method for forming the same are provided in the disclosure. In some embodiments, the semiconductor device 100 includes the capacitor 175 disposed in the opening 132 and electrically connected to the underlying conductive contact 121. The capacitor 175 includes the bottom electrode 135', the top electrode 165 disposed over the bottom electrode 135', and the dielectric structure 159 disposed between and separating the top electrode 165 and the bottom electrode 135'. The dielectric structure 159 is a composite structure including the dielectric layer 155 and the dielectric portions 157 disposed over the dielectric layer 155. The dielectric portions 157 are located at the top corners TC of the opening 132, and are formed by a deposition process having a lower step coverage than the deposition process used for forming the dielectric layer 155. Therefore, the overall thickness of the dielectric structure 159 at the top corners TC of the opening 132 may be increased, which prevent or reduce leakage current between the top electrode 165 and the bottom electrode 135', especially around the top corners TC of the opening 132. As a result, the overall device performance may be enhanced, and the yield rate of the semiconductor device 100 may be increased.

In one embodiment of the present disclosure, a semiconductor device is provided. The semiconductor device includes a conductive contact disposed over a semiconductor substrate, and a first dielectric layer disposed over the conductive contact. A top surface of the conductive contact is exposed by an opening. The semiconductor device also includes a bottom electrode extending along sidewalls of the opening and the top surface of the conductive contact, and a top electrode disposed over the bottom electrode and separated from the bottom electrode by a dielectric structure. The dielectric structure includes a second dielectric layer and dielectric portions disposed over the second dielectric layer. The dielectric portions cover top corners of the opening and extend partially along the sidewalls of the opening.

In another embodiment of the present disclosure, a semiconductor device is provided. The semiconductor device includes a conductive contact disposed over a semiconductor substrate, and a first dielectric layer disposed over the conductive contact. The semiconductor device also includes a capacitor penetrating through the first dielectric layer to contact a top surface of the conductive contact. The capacitor includes a bottom electrode extending along sidewalls of the first dielectric layer and the top surface of the conductive contact, and a top electrode covering the bottom electrode and extending over the first dielectric layer. The capacitor also includes a dielectric structure separating the top electrode from the bottom electrode and the first dielectric layer. The dielectric structure includes a second dielectric layer and dielectric portions disposed over the second dielectric layer, and the dielectric portions are located at top corners of the first dielectric layer.

In yet another embodiment of the present disclosure, a method for forming a semiconductor device is provided. The method includes forming a conductive contact over a semiconductor substrate, and forming a first dielectric layer covering the conductive contact. The method also includes partially removing the first dielectric layer to form an opening exposing a top surface of the conductive contact, and forming a bottom electrode covering sidewalls of the opening and the top surface of the conductive contact. The method further includes depositing a second dielectric layer over the bottom electrode using a first process, and depositing dielectric portions over the second dielectric layer and at top corners of the opening using a second process. The first process has a first step coverage, the second process has a second step coverage, and the second step coverage is smaller than the first step coverage. In addition, the method includes forming a top electrode covering the second dielectric layer and the dielectric portions.

The embodiments of the present disclosure have some advantageous features. By forming the composite dielectric structure in the capacitor to separate the top electrode and the bottom electrode, the leakage current between the top electrode and the bottom electrode may be prevented or reduced. As a result, the device performance may be enhanced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
   a conductive contact disposed over a semiconductor substrate;
   a first dielectric layer disposed over the conductive contact, where in a top surface of the conductive contact is exposed by an opening;
   a bottom electrode extending along sidewalls of the opening and the top surface of the conductive contact; and
   a top electrode disposed over the bottom electrode and separated from the bottom electrode by a dielectric structure, wherein the dielectric structure comprises a second dielectric layer and dielectric portions disposed over the second dielectric layer, the dielectric portions cover top corners of the opening and extend partially along the sidewalls of the opening.

2. The semiconductor device of claim 1, wherein a bottom surface of each of the dielectric portions in the opening is higher than a bottom surface of the top electrode in the opening.

3. The semiconductor device of claim 1, wherein an upper portion of the top electrode in the opening is in direct contact with the dielectric portions, and a lower portion of the top electrode in the opening is in direct contact with the second dielectric layer.

4. The semiconductor device of claim 1, wherein a top surface of the first dielectric layer is higher than a top surface of the bottom electrode.

5. The semiconductor device of claim 4, wherein the top surface of the bottom electrode is covered by the second dielectric layer.

6. The semiconductor device of claim 4, wherein the top surface of the bottom electrode is higher than a bottom surface of each of the dielectric portions in the opening.

7. The semiconductor device of claim 4, wherein the top electrode, the dielectric portions and the second dielectric layer extend over the top surface of the first dielectric layer.

8. A semiconductor device, comprising:
   a conductive contact disposed over a semiconductor substrate;
   a first dielectric layer disposed over the conductive contact; and
   a capacitor penetrating through the first dielectric layer to contact a top surface of the conductive contact, wherein the capacitor comprises:
      a bottom electrode extending along sidewalls of the first dielectric layer and the top surface of the conductive contact;
      a top electrode covering the bottom electrode and extending over the first dielectric layer; and
      a dielectric structure separating the top electrode from the bottom electrode and the first dielectric layer, wherein the dielectric structure comprises a second dielectric layer and dielectric portions disposed over the second dielectric layer, wherein the dielectric portions are located at top corners of the first dielectric layer.

9. The semiconductor device of claim 8, wherein the second dielectric layer covers the bottom electrode and extends over the first dielectric layer, and the top electrode is in direct contact with the second dielectric layer.

10. The semiconductor device of claim 8, wherein a first portion of the second dielectric layer is sandwiched between the dielectric portions and the first dielectric layer, and a second portion of the second dielectric layer is sandwiched between the dielectric portions and the bottom electrode.

11. The semiconductor device of claim 8, wherein a bottommost surface of each of the dielectric portions is in direct contact with the top electrode.

12. The semiconductor device of claim 11, wherein a top surface of the bottom electrode is higher than the bottommost surface of each of the dielectric portions.

13. The semiconductor device of claim 8, further comprising:
- a gate structure disposed in the semiconductor substrate;
- a source/drain region disposed in the semiconductor substrate and adjacent to the gate structure, wherein the capacitor is electrically connected to the source/drain region through the conductive contact.

* * * * *